BONDING ELECTRICAL CONDUCTORS

Filed April 19, 1968

INVENTORS
KENNETH CHARLES ARTHUR BINGHAM
ALAN GEORGE ALBERT GILLINGHAM
BY Hane and Baxley
ATTORNEYS United States Patent Office 3,555,664
Patented Jan. 19, 1971

3,555,664

BONDING ELECTRICAL CONDUCTORS

Kenneth Charles Arthur Bingham, Chalfont St. Peter, and Alan George Albert Gillingham, St. Albans, England, assignors to International Computers and Tabulators Limited, London, England, a British company Filed Apr. 19, 1968, Ser. No. 722,663
Claims priority, application Great Britain, Apr. 29, 1967, 19,849/67
Int. Cl. B23k *21/00*
U.S. Cl. 29—470.1 5 Claims

ABSTRACT OF THE DISCLOSURE

A method of bonding is described, particularly suitable for bonding the conductors of an integrated circuit module, for example, to a set of conductors supported on a substrate. In conventional techniques a module is compression welded to a pattern of protuberances formed on a set of conductors, and it is frequently found that under normal manufacturing tolerances a high proportion of weld failures may be expected. The present disclosure envisages the formation of pillars of a soft, readily deformable material, such as a tin/lead eutectic, between the conductors so that during compression welding the pillars are deformed under the welding pressure, thus enabling all the conductors to make good electrical contact with their respective pillars, despite any discrepancies in height that may exist as between the pillars. The use of an oxidizable material, such as the tin/lead eutectic as noted above, could result in the formation of an oxide layer which would prevent a good electrically conductive bonding being established, and in this case it is proposed to form a layer of an oxidation-resistant material, such as gold, over any exposed contacting surface of a pillar. This layer, besides being itself resistant to oxidation preferably also presents a hard surface to the conductor to which it is to be bonded and the welding pressure is sufficient to ensure that this surface breaks through any oxide layer present on the surface of the conductor, a feature of importance where the conductor is, for example, of aluminium.

BACKGROUND OF THE INVENTION

This invention relates to methods of bonding electrical conductors, and in particular to methods of bonding electrical conductors which are attached to components, for example, integrated circuits, to further conductors, such as interconnecting conductors supported on substrates.

It has previously been proposed to interconnect components, such as integrated circuits by providing conductors electrically connected to the circuits and bonding these conductors by compression welding respectively to a further set of conductors supported on a substrate. It has also been proposed to facilitate the welding operation by thickening a part of one conductor of the pair to be bonded by a layer of protuberance of gold. The use of these protuberances has been found to introduce other difficulties in making an adequate electrical connection because in their formation within the limits of typical manufacturing tolerances it has been found that very small differences in height of the protuberances frequently lead to poor bonding, or even to failures of the bonding in the case of the lowest protuberances, resulting in an undue proportion of rejected assemblies. This, in turn, results in considerable wastage in the use of integrated circuit chips, thereby unduly decreasing the apparent yield of usable chips from the chip manufacturing process.

SUMMARY OF THE INVENTION

According to the present invention a method of bonding a first set of electrical conductors to a second set of electrical conductors includes the steps of forming readily deformable pillars of soft electrically conductive material respectively placed in electrical contact one with each of the conductors of said first set, the pillars having free ends remote from the conductors of said first set respectively; bringing the second set of conductors respectively adjacent one to each of the free ends of said pillars; and compression welding the ends of all the pillars respectively to the conductors, the pressure applied during the welding step being only sufficient differentially to deform said pillars to bring all the conductors of the sets respectively into good electrical contact with the ends of the pillars.

Typically the pillars are formed of an oxidizable material, such as a lead/tin eutectic, and in this case the pillars may have layers of an oxidation resistant material formed over their ends. These layers may be of a hard material, such as gold and in this case the layers are sufficiently harder than the pillars to break through an oxide surface on the conductors (which may, for example, be of aluminium) during the welding step. The pillars may be formed by deposition through a mask directly on to conductors supported on a substrate, as may the layers of hard material.

The differential deformation of the pillars during the welding step allows the shortest pillars to be brought into good electrical contact with the conductors and greatly reduces the incidence of poor bonding previously referred to.

DESCRIPTION OF THE PREFERRED EMBODIMENT

Figure 1:
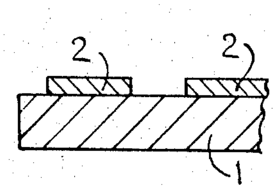
FIGS. 1 through 7 of the accompanying drawing show, by way of example, sectional views illustrating steps in the formation of the pillars and the bonding of electrical conductors as set forth in the following description.

Referring now to FIG. 1 of the drawing, a substrate 1 supports a set of electrical conductors 2. The conductors 2 are preferably of gold, and are formed in conventional manner by vacuum deposition on to the substrate 1 through a mask (not shown).

Figure 2:
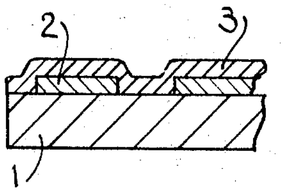
Figure 3:
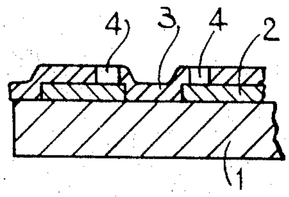

As shown in FIG. 2 a layer of a positive photoresist 3 is then deposited over the conductors 1 on the substrate 2. At each point at which a connection is to be made between the conductors 1 and further conductors to be described, an aperture 4 (FIG. 3) is formed in the resist layer 3 in the following manner. The resist layer 3 is exposed to ultraviolet light through holes in a mask, the holes corresponding to the required connection positions and diameters. The resist layer 3 is then developed, thereby removing the portions of the resist 3 where the connections are to be formed. The conclusion of this step is shown in FIG. 3.

Figure 4:
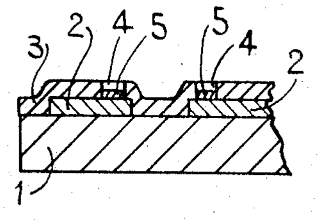

For the next step, as illustrated by FIG. 4, the substrate 1 is immersed in a lead/tin plating bath, the composition of which may be 25 g./litre lead, 55 g./litre tin and 50 g./litre fluoboric acid. A layer of tin/lead eutectic 5 of, say 0.0008 inch thickness is thereby built up to form a pillar at each connection position on the gold conductors 2. The surface of the tin/lead eutectic layer is subject to oxidation however. Consequently, the substrate is quickly cleaned with a fluoboric acid rinse followed by a rinse in mains water and a rinse in demineralised water.

Figure 5:
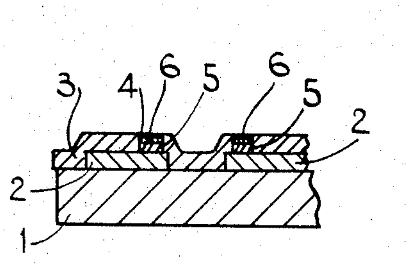
Figure 6:
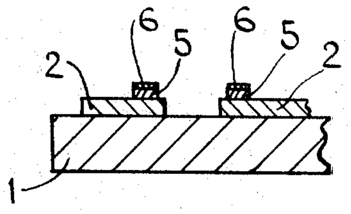

The substrate 1 is then immersed in a gold potassium cyanide plating solution and a layer of gold 6 of, say, 0.0002 inch thickness is plated on to the tin/lead layer 5, thereby forming a composite pillar at each desired position as shown in FIG. 5. The remainder of the photoresist layer is then removed using a solvent, and the resultant structure is illustrated in FIG. 6.

Figure 7:
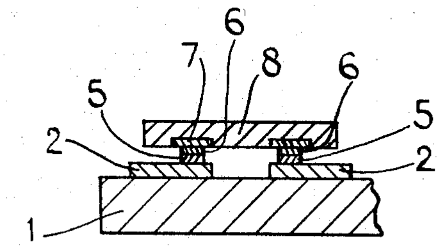

A second set of conductors 7 (FIG. 7) is carried by an integrated circuit chip 8. The conductors of the second set are formed during the manufacture of the integrated circuit and are usually carried as lands on one face of the chip 8. These conductors 7 are frequently of aluminium. The chip 8 is oriented so that the conductor 7 of the second set are opposite the composite pillars 5, 6 carried by the conductors 2. It will be realized that the conductors 2 carried by the substrate 1 are arranged in a pattern to bring the pillars 5, 6 into the arrangement required by the conductors 7 of the integrated circuit chip 8.

When the chip is in position the conductors 7 and the pillars are welded together by pressure, preferably from an ultrasonic welding tool applied to the chip. Hence bonds are formed between the conductors 7 and the interconnecting conductors 2 on the substrate 1.

The use of pillars formed solely by a layer of gold of 0.001 inch thickness has been investigated and it has been found that a problem arises when several pillars are used to connect a chip to a conductor pattern. Despite very careful formation of the conductors and the pillars, it is possible for the tops of the pillars to lie at different levels relative to the substrate. When the chip is positioned on the pillars and the welding operation is performed, the lands are readily bonded to the higher pillars. The highest pillars can compress only very slightly, so that, where the difference in height between the highest and lowest pillars is minimal, a satisfactory bond to lower pillars may also be obtained. However, the gold is relatively hard (for example 70 Vickers Diamond Pyramid Number) so the possible compression of the pillars is limited, and it frequently happens that the differences in height of the pillars is so great that the lowest pillars may not make proper contact with the lands and the welding operation may, therefore, fail in respect to those pillars.

Pillars made solely from a soft lead/tin eutectic (approximately 20 Vickers Diamond Pyramid Number) have been found to compress adequately to allow differential deformation of the pillars to bring the conductors respectively into contact with all the pillars. Where conductors of oxidizable material are used, such as aluminium for example, reliable bonds may still not be obtained. Possible reasons for this are that the soft material does not break through the aluminium oxide layer on the aluminium lands 7 during the welding operation and that a layer of tin and/or lead oxide may be formed on the pillar and may hinder the formation of a reliable bond.

The composite pillars such as are described above largely overcome this second problem. The soft layer 5 allows considerable deformation whilst the harder gold layer 6 also prevents the formation of any tin and/or lead oxide layer and has been found to assist in effecting the bonding of the pillars to the conductors. Thus it will be seen that the composition of the pillar is largely dependent upon the materials used for the conductors and upon the avoidance of oxidation of the contacting surfaces of the conductors and the pillars.

Although a lead/tin eutectic has been proposed above, other suitable soft materials such as silver, copper, cadmium, lead, zinc or indium might be used in the forming of the deformable layer 5 of each pillar. Similarly, although gold is preferred as an oxidation resistant layer 6 to cap the pillars because it is of suitable hardness and is easy to electroplate, other suitable materials might be used for this purpose.

Furthermore, the pillars need not be formed on the conductors 2 on the substrate. They might be formed on the conductors or conductive lands 7 of the circuit chip or they might be formed completely separate from both conductors 2 and lands 7, the welding operation then bonding the pillars 5, 6 to both conductors and lands simultaneously. The pillars might then, for example, be formed of a soft deformable layer capped at both ends by harder layers.

The conductors 2 and the lands 7 might be of different materials from those described above. For example, the conductors 2 might be of aluminium. The lands 7 might be of molydenum. Finally, it is to be understood that although the foregoing description has assumed that the conductors, or lands, 7 are part of an integrated circuit chip, the invention is not limited to this particular application but is generally useful for bonding together conductors of two sets which are respectively aligned with one another but in which the conductors of a set are individually fixed relative to one another. Thus, the invention may be employed in securing other components than integrated circuit chips to connecting conductors, for example.

We claim:

1. A method of bonding first electrical conductors mounted on a first rigid substrate to corresponding second electrical conductors mounted on a second rigid substrate including the steps of forming on each first electrical conductor a readily deformable pillar by depositing on each first conductor a first layer of soft deformable electrically conductive material and then depositing on each first layer a second layer of material which can be readily joined to said second conductors by cold welding: positioning the second substrate adjacent the first substrate such that the second conductors are aligned one with each of a different one of said pillars respectively; applying a pressure to urge the first and second substrates toward one another sufficient to differentially deform the first layer in the pillars to cause substantially uniform contact between the second conductors and the second layer of the pillars despite irregularity of initial contact between the pillars and the second conductors; and joining the second conductors to the pillars by cold welding the second conductors to the second layer of the pillars.

2. A method of bonding as claimed in claim 1 including the steps of applying a masking layer to the first conductors and the first substrate; processing the masking layer to form apertures in the masking layer over the first conductors; depositing a layer of lead/tin eutectic in the apertures; depositing a layer of gold on each of the layers of lead/tin eutectic in the apertures; and removing the remainder of the masking layer prior to the step of positioning the second conductors adjacent one to each of said pillars.

3. A method of bonding first electrical conductors mounted on a first rigid substrate to corresponding second electrical conductors mounted on a second rigid substrate including the steps of forming a plurality of readily deformable pillars of soft electrically conductive first material; depositing on opposite ends of each pillar a layer of a material which can be readily joined to said conductors by cold welding; positioning the first substrate, the pillars and the second substrate so that the first conductors are aligned with the corresponding second conductors and the pillars are positioned therebetween with said opposite ends adjacent the first and second conductors respectively; applying a pressure to urge the first and second substrates toward one another sufficient to differentially deform the pillars to cause substantially uniform contact between the conductors and the layers of material on the pillars despite irregularity of initial contact between said layers and said conductors; and joining the first and second conductors to the pillars by cold welding the conductors to the layers of the pillars.

4. A method as claimed in claim 3 wherein said deformable pillars are formed of a lead/tin eutectic.

5. A method as claimed in claim 3 wherein said layers of material are formed of gold.

References Cited

UNITED STATES PATENTS

| | | | |
|---|---|---|---|
| 2,740,193 | 4/1956 | Pessel | 29—490X |
| 3,184,831 | 5/1965 | Siebertz | 29—471.1X |
| 3,330,026 | 7/1967 | Best et al. | 29—497.5X |
| 3,353,073 | 11/1967 | Majima et al. | 29—470.1X |

| | | | |
|---|---|---|---|
| 3,403,438 | 10/1968 | Best et al. | 29—472.1X |
| 3,447,236 | 6/1969 | Hatcher, Jr. | 29—472.3X |
| 3,470,611 | 10/1969 | McIver | 29—497.5X |
| 3,180,022 | 4/1965 | Briggs et al. | 29—502X |

OTHER REFERENCES

"Solders and Soldering," by H. H. Manko, see especially pp. 35–43.

JOHN F. CAMPBELL, Primary Examiner

R. B. LAZARUS, Assistant Examiner

U.S. Cl. X.R.

29—471.1, 472.3, 497.5, 502